United States Patent [19]
Aubert

[11] Patent Number: 5,168,231
[45] Date of Patent: Dec. 1, 1992

[54] NMR IMAGING DEVICE, METHOD FOR CORRECTING INHOMOGENEITY AND METHOD FOR MAKING MAGNETS USED IN THIS DEVICE

[75] Inventor: Guy Aubert, Grenoble, France

[73] Assignee: Centre National de la Recherche Scientifique, Paris, France

[21] Appl. No.: 487,949

[22] PCT Filed: Nov. 10, 1988

[86] PCT No.: PCT/FR88/00557
§ 371 Date: May 11, 1990
§ 102(e) Date: May 11, 1990

[87] PCT Pub. No.: WO89/04494
PCT Pub. Date: May 18, 1989

[30] Foreign Application Priority Data

Nov. 13, 1987 [FR] France ................. 87 15670

[51] Int. Cl.⁵ .................... G01V 3/00; H01F 7/02
[52] U.S. Cl. .................................... 324/320; 335/306
[58] Field of Search .............. 324/300, 318, 319, 320; 335/296, 302, 303, 306

[56] References Cited

U.S. PATENT DOCUMENTS

| | | | |
|---|---|---|---|
| 4,639,673 | 1/1987 | Zijlstra | 324/319 |
| 4,758,813 | 7/1988 | Holsinger et al. | 335/306 |
| 4,771,244 | 9/1988 | Vermilyea | 324/320 |

FOREIGN PATENT DOCUMENTS

| | | |
|---|---|---|
| 0167059 | 1/1986 | European Pat. Off. |
| 0171831 | 2/1986 | European Pat. Off. |
| 0216404 | 4/1987 | European Pat. Off. |
| 0222281 | 5/1987 | European Pat. Off. |
| 2549281 | 1/1985 | France |
| 0193230 | 8/1987 | Japan ................. 324/320 |
| 2184243 | 6/1987 | United Kingdom |
| 8808126 | 10/1988 | World Int. Prop. O. |

OTHER PUBLICATIONS

Review of Scientific Insutruments, vol. 56, No. 1, Jan. 1985, D. I. Hoult et al.: "Shimming a Superconducting Nuclear-Magnetic-Resonance Imaging Magnet With Steel", pp. 131-135.

*Primary Examiner*—Louis Arana
*Attorney, Agent, or Firm*—Oblon, Spivak, McClelland, Maier & Neustadt

[57] ABSTRACT

Inhomogeneities in a magnetic field are corrected by means of openings of square or polygonal cross-section in the periphery of the magnet. Permanent magnets required for obtaining the desired correction are lodged in the openings. Thus, the orientation of the permanent magnets can only assume a limited number of values, which simplifies the calculation to determine the positions of the magnets used to correct the inhomogeneity of the magnetic field. It is mainly applicable to the correction of inhomogeneity of the magnetic field of a magnet used in nuclear magnetic resonance imaging.

10 Claims, 7 Drawing Sheets

FIG_1

FIG_2

FIG_3

FIG_4

FIG_5

FIG_6

FIG_7

FIG_8

FIG_12

FIG_11

FIG_13

NMR IMAGING DEVICE, METHOD FOR CORRECTING INHOMOGENEITY AND METHOD FOR MAKING MAGNETS USED IN THIS DEVICE

The present invention is due to the collaboration of the *Service National des Champs Intenses* (Director: Mr. Guy AUBERT), and its object is a device for the correction, by magnetic elements, of the inhomogeneities of the magnetic field produced by a magnet. It particularly concerns an NMR imaging device, called an MRI device, a method for correcting inhomogeneity and a method for making magnets used in the device. The invention finds application particularly in medicine where magnets are used in methods of imaging by nuclear magnetic resonance. However, it can be applied in other fields, notably in the field of scientific research where intense fields are generated with magnets.

Magnetic resonance is a phenomenon of oscillation of the magnetic moment of the nuclei of the atoms or molecules of a body, at a frequency that depends on the intensity of a magnetic field in which this body is bathed. This means that if the intensity of the magnetic field varies, the frequency of the resonance phenomenon varies too. Hence, for technological and technical reasons, it is of the utmost importance that the field produced by the magnet should be very homogeneous in its zone of interest. The homogeneity required is commonly in the range of some parts per million in medicine, or even some parts per billion (1,000,000,000) in the scientific field. To achieve this goal, it is sought to build magnets that give a field that is as perfectly homogeneous as possible.

Unfortunately, however much care is taken in building magnets, their construction is never as perfect as the theory that has led to their design. Besides, even if this fault can be removed, the magnet, in order to be used, must be placed physically in a given place. Now, none of the regions of the space in an industrial or urban environment is wholly free of disturbing magnetic elements. The result thereof is that once the magnet is installed on the site, the field that it produces in a zone of interest has inhomogeneities that have to be corrected.

The principle of the correction of the inhomogeneities of fields is that of superimposition: namely the addition of coils, magnetic parts or any other means enabling the imperfections of the main field to be corrected and a total homogeneous field to be obtained in the zone of interest. A known method for correcting the inhomogeneities of the magnetic field produced by a magnet consists in using magnetic elements, such as magnetizable bars, made of soft iron for example, that are placed in the environment of the magnet and exert their influence in a zone of interest of the magnet so as to correct inhomogeneities of the field in this zone.

Such a method is commented upon by D. I. HOULT and D. LEE in "Shimming A Superconducting Nuclear Magnetic Imaging Magnet With Steel", *Sci. Instrum.*, January 1985, pp. 131 to 135. The article deals particularly with a magnet for nuclear magnetic resonance imaging instruments. The magnet has the shape of a circular cylinder, within which is located the zone of interest, the centre of which is placed on the axis of the magnet, the magnetic field produced by the magnet being within this magnet, substantially parallel to the axis of the magnet. This document gives a detailed description of a method of calculation which can be used to determine the dimensions and the position of one or more magnetic bars made of soft steel around the axis of the magnet, as a function of a point of the volume of interest where an inhomogeneity of the field has to be corrected, the length of these corrective magnetic bars being parallel to the axis of the magnet.

Despite its relative complexity, such a method provides for the efficient correction of the possible inhomogeneities of the magnetic field in the volume of interest through the positioning of one or more corrective magnetic bars, of which the section, length and position with respect to the volume of interest are determined on the basis of known calculations, these bars being of the type indicated notably in the above-mentioned article. However, as is known, this method has the drawback of being not easily applicable in the context of an industrial-scale fabrication of magnets. For taking in account especially, on the one hand, the fabrication tolerances which may introduce differences, from one magnet to another, in the magnetic fields produced by these magnets and also taking into account, on the other hand, the elements which, on the site of installation, are liable to disturb the magnetic field, it is necessary to redefine, at the same time, the length, the cross-section and the position of the corrective magnetic bars when the magnet is already installed on the site, i.e. the bars should be cut and positioned to measure for each application.

Furthermore, in the Patent FR 86 18358, the present Applicant has described a device for correcting magnetic field inhomogeneity in a magnet using magnetic bars. These bars, which may be housed in tubes, may take any position whatsoever parallel to the field and, moreover, the lengths may have any values. This method has the drawback of taking up a certain amount of space within the useful volume of the magnet.

In the Patent FR 86 06862, the present Applicant has described a device for correcting magnetic field inhomogeneity using magnetic elements adjustable in orientation. In this case, the calculations needed to determine the configuration of the magnets with a desired field homogeneity are very lengthy, and it is not easy to install them in the calculated positions and orientations.

The device according to the present invention has apertures or conduits with rectangular or square sections. This enables the limiting of certain parameters of position and orientation of the magnets and consequently provides for simplifying the calculations that determine the configuration of the magnets, enabling efficient correction of magnetic field inhomogeneity. In the device according to the present invention, rectangular parallelepiped shaped or, advantageously, cube-shaped magnets are used, with predetermined magnetisations in direction and in amplitude. Thus, the magnetisation that may be used in the corrections of inhomogeneity of the magnetic fields is quantified. This quantification provides, firstly, for simplifying the calculations and, secondly, for having standard, factory-made magnets for the corrections done on site.

The principle of the invention lies in this quantification, at least in one dimension, of the positions that may be taken by the corrective magnets. Thus, the use of magnets with other shapes such as, for example, elements with triangular, pentagonal, hexagonal or, more generally, polygonal sections does not go beyond the scope of the invention.

For example, a cube-shaped magnet may take six orientations within a square-sectioned conduit. Magnets possessing a variety of magnetic moment amplitudes are available. In the calculation for optimising the homogenisation of the magnetic field, the values of the magnetic moments of the corrective magnets are entered as constraints. This restricts the number of possibilities to be analysed and, consequently, the number of calculations to be made. By contrast, the arrangement of the cubes inside the conduits remains continuously adjustable inasmuch as spacers of variable length are available.

The invention is not restricted to the correction of magnetic field inhomogeneity. It enables any modification that may be desired on a static magnetic field such as, for example, the obtaining of a static magnetic field gradient.

The main object of the invention is the device and method as described in the claims.

The invention will be understood more clearly from the following description and from the appended Figures, given as non-restrictive examples, of which:

FIGS. 1 to 13 use the same references to designate the same elements.

Figure 1:
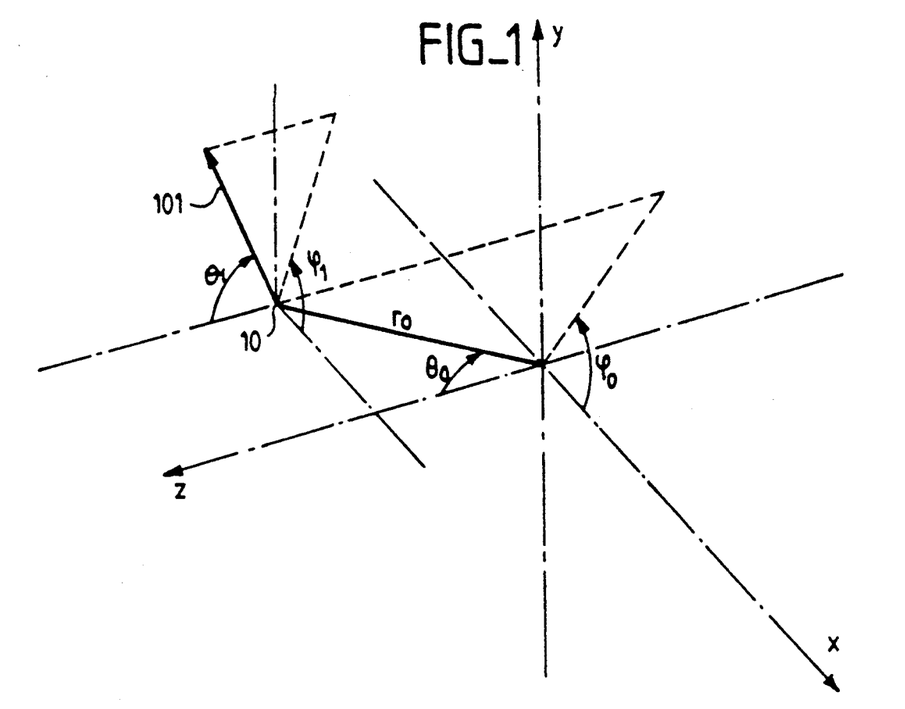
FIG. 1 is an explanatory diagram of the principle of correction of magnetic field inhomogeneity of a known type.

FIG. 1 shows the principle of correction of magnetic field inhomogeneity, for example inside a magnet generating a continuous high-intensity magnetic field $B_0$ of a nuclear magnetic resonance imaging device.

Let O be the centre of the magnet and O, x,y,z an orthonormal reference related to the magnet. For example, the axis z corresponds to the axis of the magnet. A correction of inhomogeneity of the magnet field is characterised by the place where the correction is applied with, for example, a permanent magnet 10, as well as the orientation and the amplitude 101 of the magnetisation of the permanent magnet 10. In FIG. 1, the position of the magnet 10 is identified in spherical coordinates by $r_o, \Theta_o, \Phi_o$, the orientation of the magnetisation of the magnet 10 is identified by the angles $\Theta_1$ and $\Phi_1$, with the length of the vector 101 determining the amplitude of the magnetisation. We thus find ourselves with a system having six degrees of freedom for each magnet, calling for an extremely lengthy calculation time, for example by computer, in order to determine the configuration necessary for achieving the desired correction.

Figure 2:
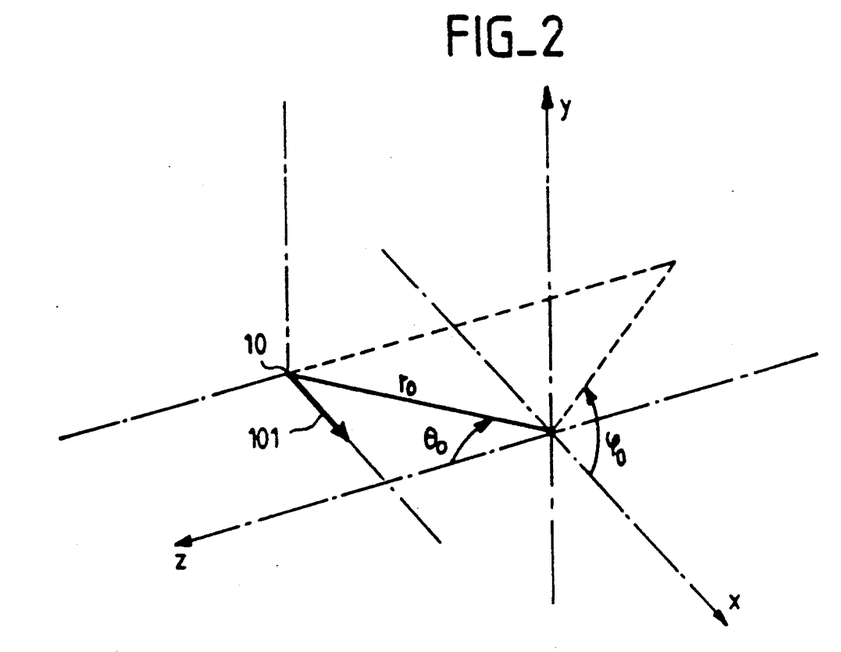
FIG. 2 is an explanatory diagram of a first elementary correction possible with the device according to the present invention.
Figure 3:
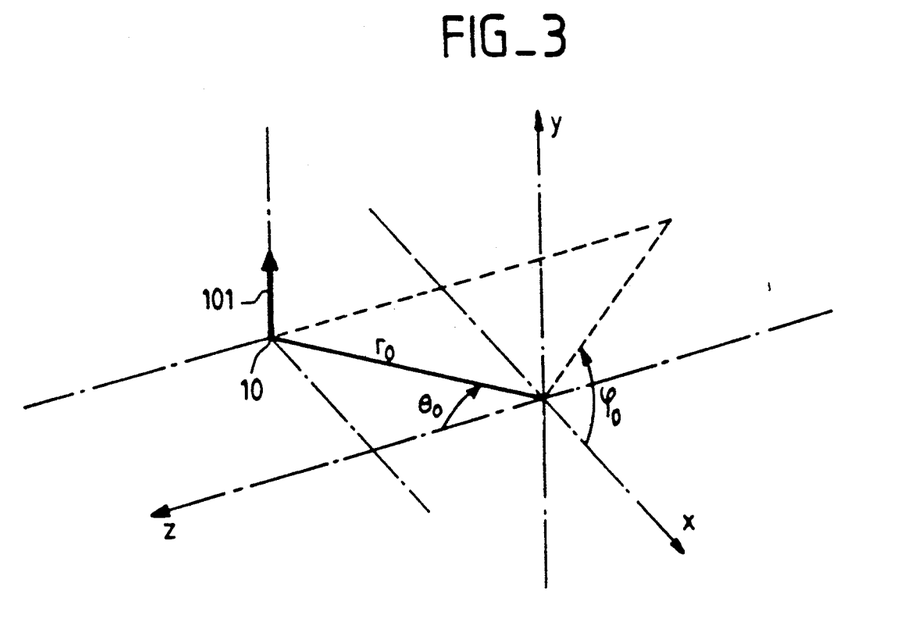
FIG. 3 is an explanatory diagram of a second elementary correction possible with the device according to the present invention.
Figure 4:
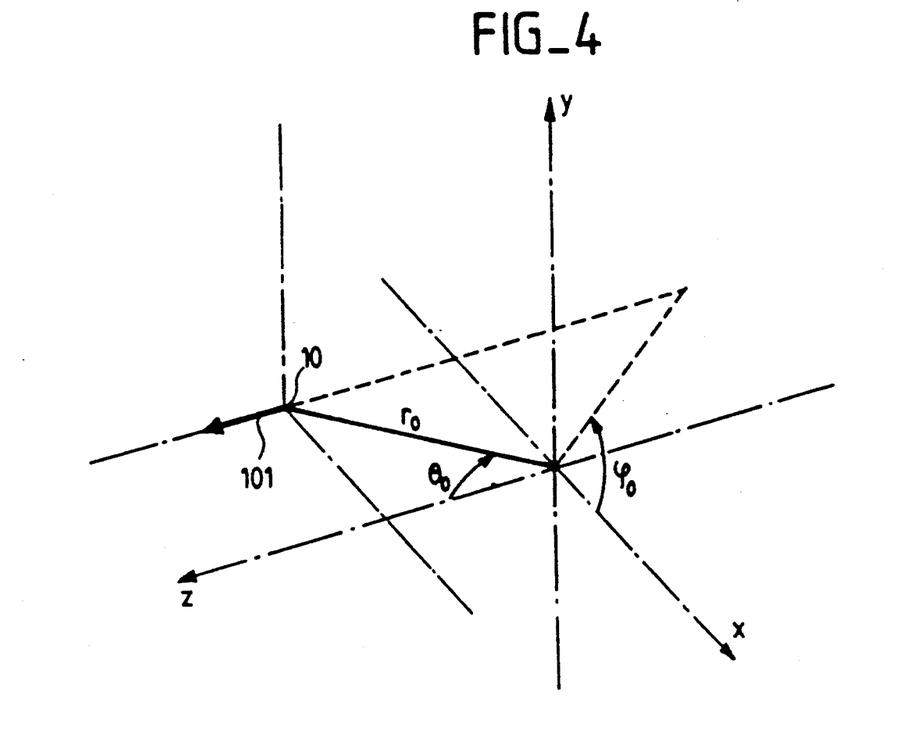
FIG. 4 is an explanatory diagram of a third elementary correction possible with the device according to the present invention.
Figure 5:
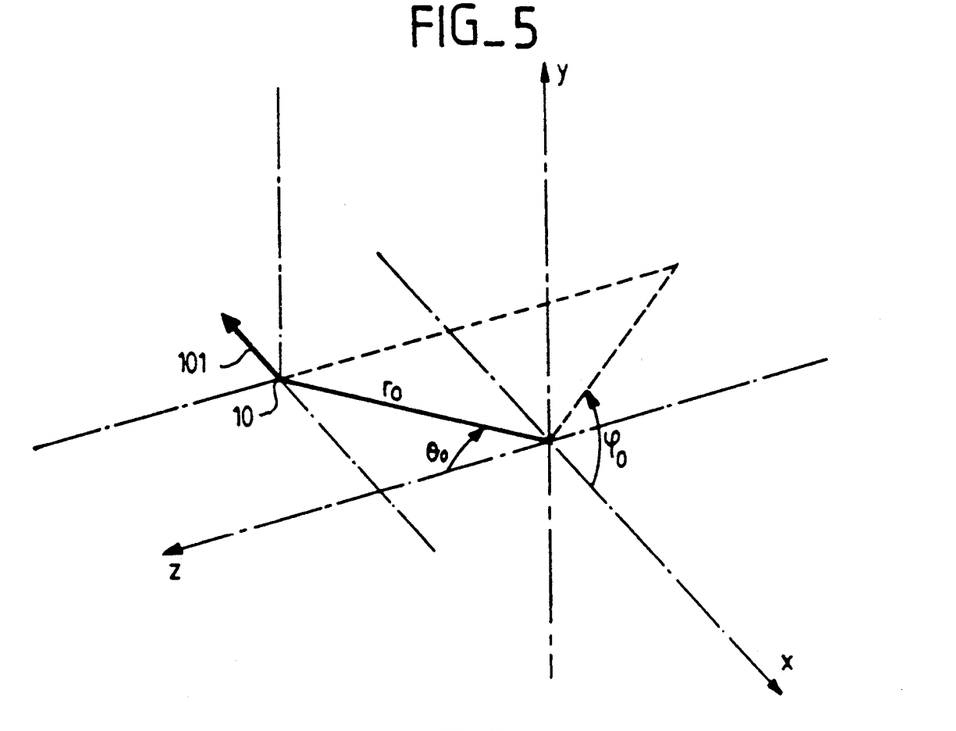
FIG. 5 is an explanatory diagram of a fourth elementary correction possible with the device according to the present invention.
Figure 6:
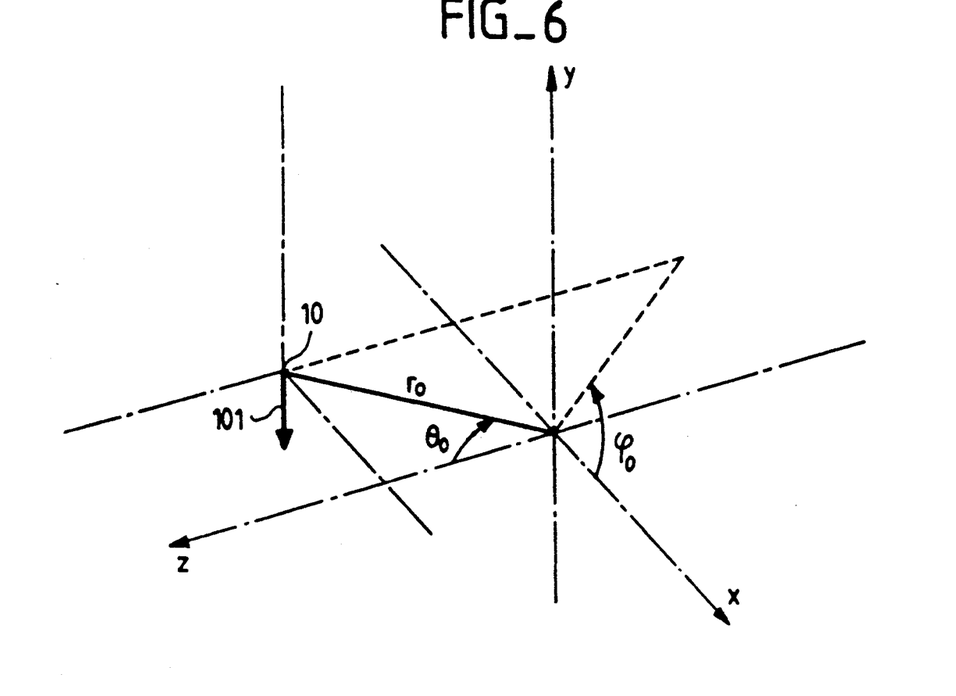
FIG. 6 is an explanatory diagram of a fifth elementary correction possible with the device according to the present invention.
Figure 7:
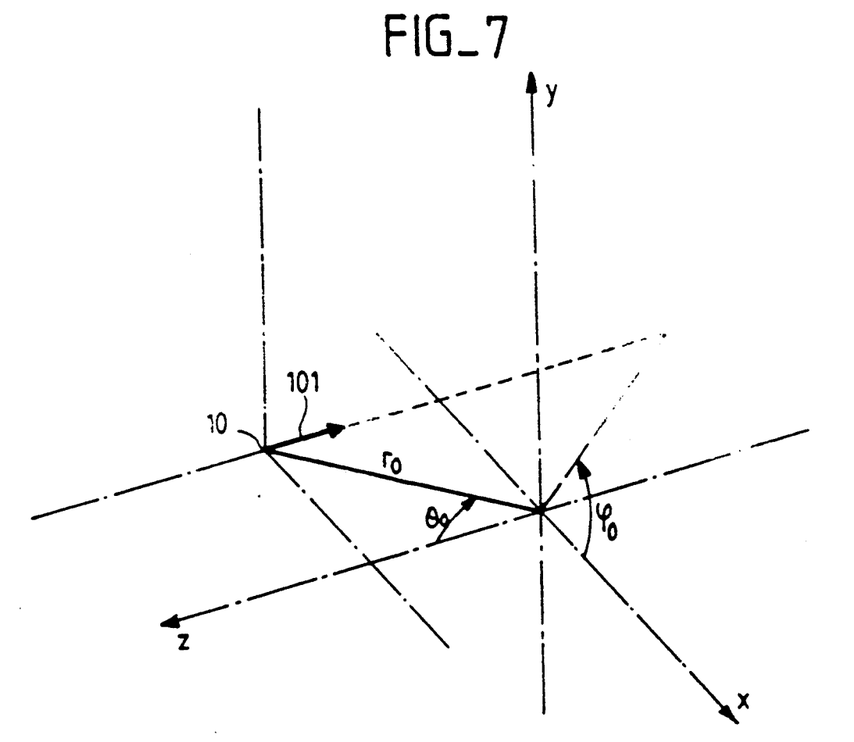
FIG. 7 is an explanatory diagram of a sixth elementary correction possible with the device according to the present invention.

FIG. 2 shows a first example of elementary correction that may be implemented in the device according to the present invention. The elementary magnets 10 are placed in apertures with rectangular sections or, advantageously, square sections parallel to the axis z. Advantageously, these apertures are placed at a fixed distance from the axis z. Thus, the calculations are limited, for the magnets 10 will not be able to take any position whatsoever in space. Furthermore, since the magnets 10 are rectangular parallelepipeds or cubes, their magnetisation can take only a limited number of positions. For example, the magnetisation is perpendicular to one of the faces of the cube. In this case, depending on the orientation of the cube, the magnetisation 101 can take only six positions. If, for example, the walls of the conduits are parallel to the planes xoz and yoz, the six positions will correspond to a positive magnetisation 101 along the x axis as illustrated in FIG. 2, to a positive magnetisation 101 along the y axis as shown in FIG. 3, to a positive magnetisation 101 along the z axis as shown in FIG. 4, to a negative magnetisation 101 along the x axis as shown in FIG. 5, to a negative magnetisation along the y axis as shown in FIG. 6 or, finally, to a negative magnetisation along the z axis as shown in FIG. 7. If, in another possible configuration, two of the walls of the conduits are positioned tangentially to a cylinder with an axis oz, it is still possible to obtain the orientations ±z shown in FIGS. 4 and 7 and, instead of the orientations ±x of the FIGS. 2 and 5 and ±y of the FIGS. 3 and 6, the orientations shown in FIGS. 8, 9, 10, 11 which correspond to:

$$\Theta_1 = \pi/2 \text{ and } \Phi_1 = \Phi_0, \Phi_0 + \pi, \Phi_0 - \pi/2, \Phi_0 + \pi/2$$

respectively.

Figure 11:
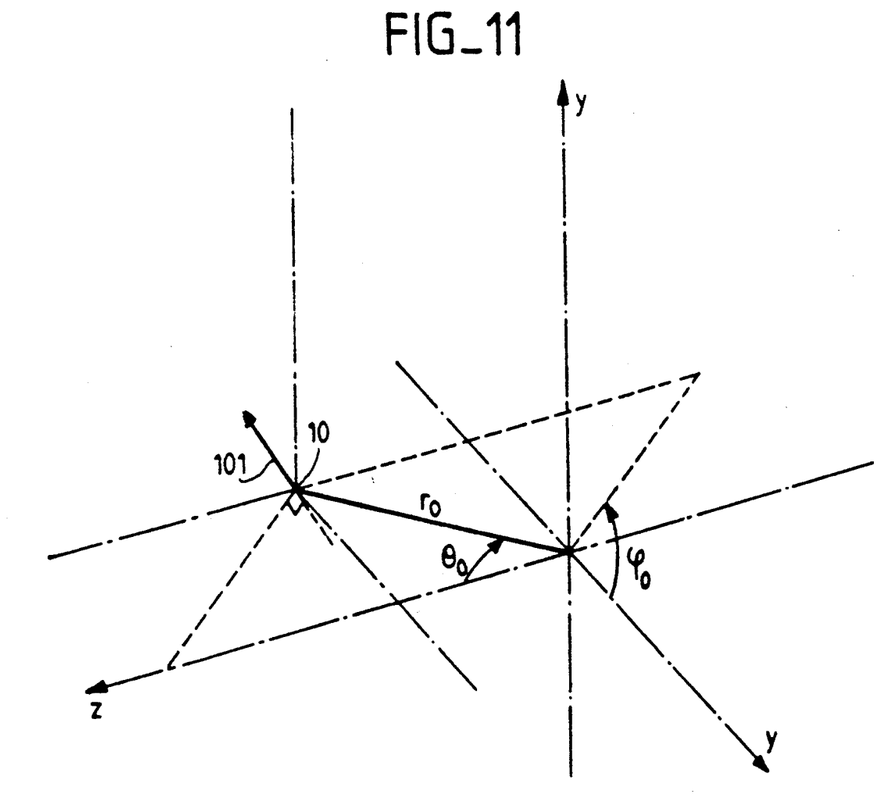
FIG. 11 is the explanatory diagram of a tenth elementary correction possible with the device according to the present invention.

The amplitude of the magnetisation 101 depends on the cube used. FIG. 11 shows an exemplary embodiment of a nuclear magnetic resonance imaging device according to the present invention. The depiction of the MRI apparatus 1 is restricted, in FIG. 12, to the elements needed for understanding the invention. The MRI device 1 has the general external shape of a circular cylinder and has a magnet 2, also cylindrical, the axis Z of which is also the longitudinal axis of the MRI apparatus 1. The magnet 2 is formed, for example, by an arrangement of electrical coils (not shown) of a known type. The magnet 2 produces a magnetic field $B_0$ which is oriented, inside the magnet 2, along the axis Z of this magnet 2. Along the axis Z of the magnet, a free internal space 4 forms a tunnel designed to receive a patient (not shown) to be examined. According to a standard arrangement, around the tunnel 4, the MRI instrument 1 has different elements (not shown): radiofrequency antennas and gradient coils. It is clear that the nuclear magnetic resonance imaging device includes signal processing devices and display means, not shown in FIG. 12.

Figure 12:
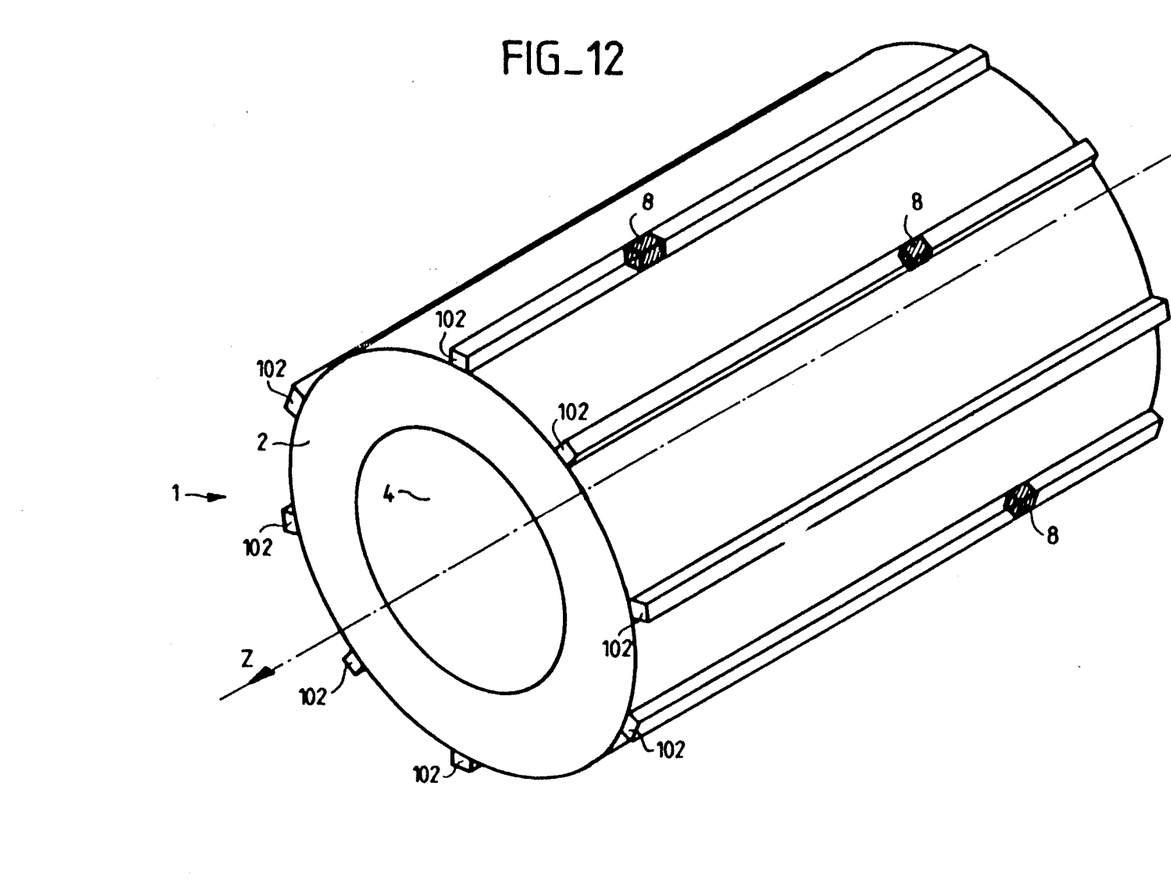
FIG. 12 is a drawing of an exemplary embodiment of a nuclear magnetic resonance imaging device according to the present invention.

Advantageously, the rectangular-sectioned or advantageously, as shown in FIG. 12, square-sectioned apertures 102 are positioned outside the magnet 2 and on its periphery. In this way, the magnets placed in the apertures 102 are only weakly influenced by the magnetic field created by the magnet 2. Thus, the magnet 2 does not modify the magnetisation of the permanent magnets 8 which may be placed in the apertures 102.

In a first alternative embodiment, the permanent magnets 8 provide for all the corrections of the homogeneity of the magnetic field $B_O$.

In a second alternative embodiment, the permanent magnets 8 are associated with standard electrical correction coils to carry out the correction.

Advantageously, the permanent magnets 8 carry out the radial corrections of the inhomogeneity of the magnetic field $B_0$ while the standard electrical correction coils carry out the axial corrections, along the axis z, of the inhomogeneity of the magnetic field $B_O$.

In a first alternative embodiment of the device including an association of electrical correction elements and the permanent magnet 8 to correct the inhomogeneities of the magnetic field, the electrical correction coils are connected to a current generator.

The number and the section of the apertures 102 depend on the type of correction to be made and on the degree of correction desired. For example, six, eight or more apertures 102 are used, distributed evenly on the periphery of the magnet 2.

Figure 8:
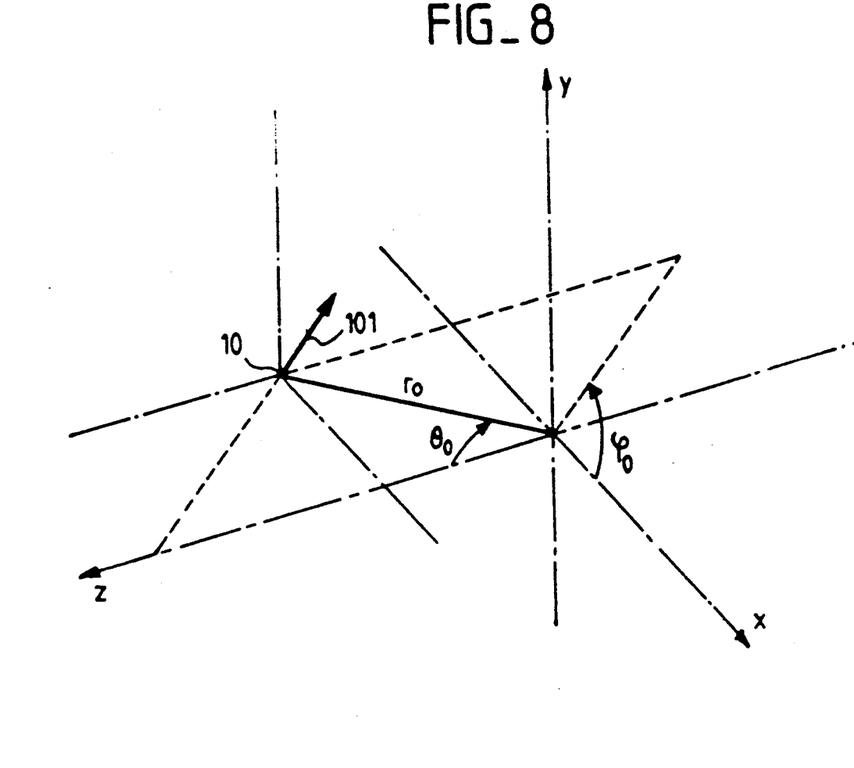
FIG. 8 is an explanatory diagram of a seventh elementary correction possible with the device according to the present invention.
Figure 9:
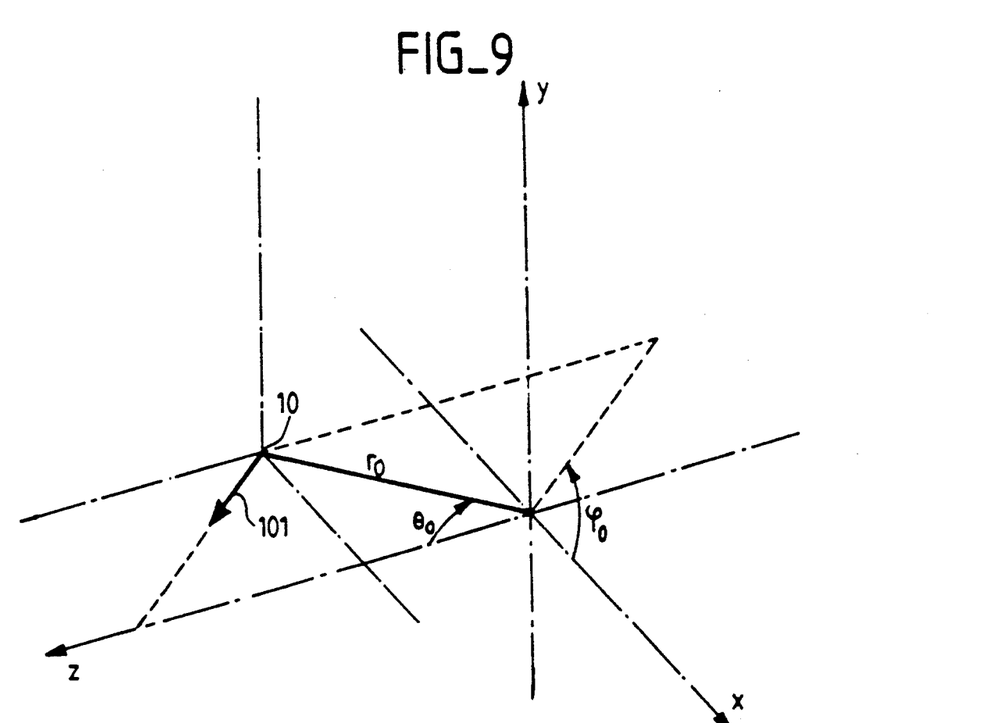
FIG. 9 is the explanatory diagram of an eighth elementary correction possible with the device according to the present invention.
Figure 10:
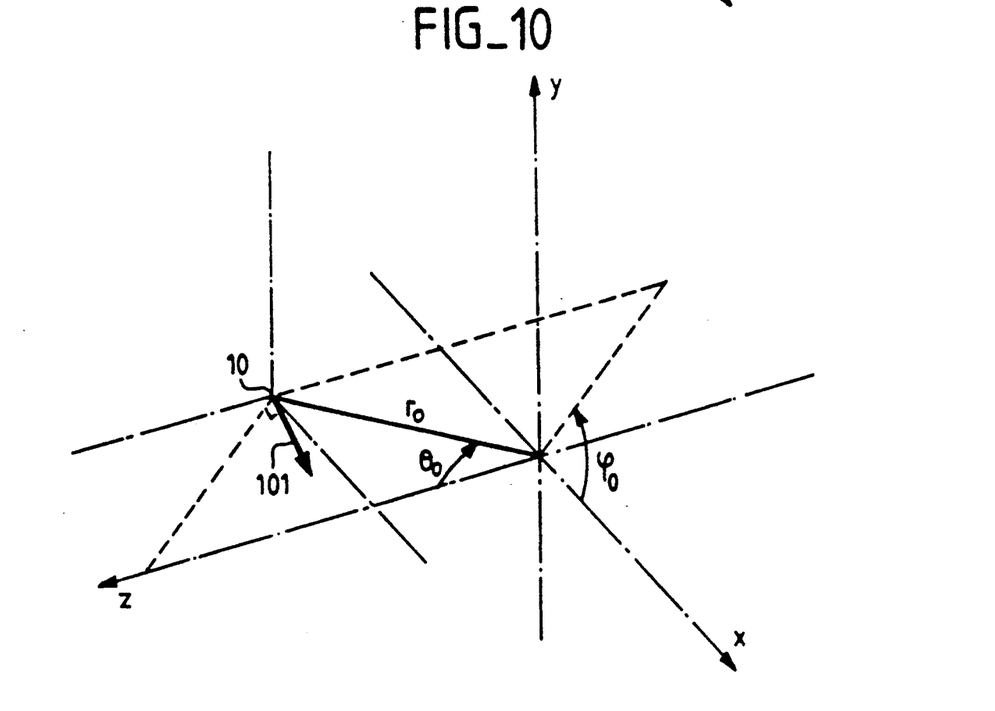
FIG. 10 is the explanatory diagram of a ninth elementary correction possible with the device according to the present invention.

To make the corrections according to the present invention, therefore, the measurements of the real field within the magnet 1 are taken, the corrections needed to obtain the desired homogeneity are computed, and the permanent magnets 8 are inserted in the apertures 102 so that they are placed in the positions that enable the desired corrections to be obtained. In FIG. 8, only some permanent magnets 8 have been shown. It is clear that the number of magnets 8 necessary for the desired correction are used. Spacers enable the precise and permanent positioning of the permanent magnets 8. The spacers are not shown in FIG. 8. It is possible, once the corrections have been made, to verify the homogeneity of the magnetic field inside the magnet 1.

It is possible to use any type of known measurement of the magnetic field inside the magnet 1. However, it is advantageous to use the device using the internal volume of a cylinder and the investigation system fitted out with this device as described in U.S. Pat. No. 4,820,882.

It is possible to use any known method of determining the corrections of magnetic field inhomogeneity to determine the values and the positions of the permanent magnets 8. Advantageously, the method described in the U.S. Pat. No. 4,812,765 is used.

In this method, an analytic expression of the field is calculated in the form of a decomposition into spherical harmonics. A calculation is also done of decompositions into spherical harmonics that are similar but relate to the field created by each of the correction fields available to correct this field. Then an algebraic combination is done of the analytic expressions of the correction means so as to produce an analytic expression of correction which, when added to the analytic expression of the real field, converts it into an analytic expression corresponding to a ideal magnetic field.

It must be noted that the limitation of the possibilities of orientation of the magnets 8 to correct the inhomogeneity of the magnetic field does not, in practice, entail any limitations of the corrections themselves while, at the same time, reducing the quantity of computations needed for the implementation of the method.

Figure 13:
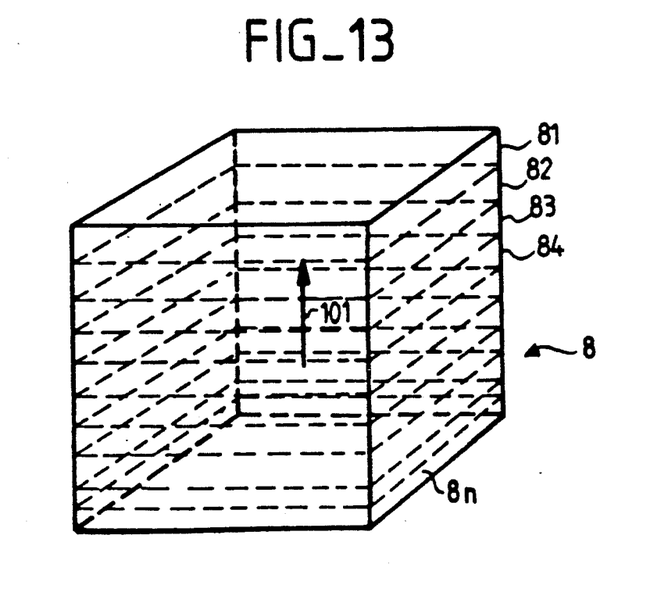
FIG. 13 is a drawing of an embodiment of a magnet that can be used in the device according to the present invention.

FIG. 13 shows an exemplary embodiment of permanent magnets 8 capable of being implemented in the device according to the present invention. The magnets 8, which can be implemented in the device according to the present invention, have a plurality of layers 81, 82 up to 8n. In the non-restrictive example illustrated by FIG. 9, n is equal to 10. Thus, to make a magnet 8, it is possible to use as many magnets, made of samarium-cobalt or iron-neodymium-boron for example, as are desired and as are necessary to obtain a desired amplitude of magnetisation. Once the magnetisation is achieved, the layers that do not have to contribute to the magnetisation are filled with nonmagnetic materials such as, for example, aluminium or plastic. It is clear that the magnetic layers are not necessarily consecutive but can also be separated by nonmagnetic filling layers. Advantageously, the magnetisation 101 is perpendicular to one of the faces of the cube 8.

Thus, it is possible to achieve factory production of a large quantity of magnets 8 having various values needed to make corrections. On site, where it is desired to make the corrections, there is no need to modify the magnets 8 which form increments of the quantified corrections. A varying number of magnets 8, having various magnetisations that depend on the correction to be made, is used. Inasmuch as the magnets 8 are standard pieces, those of these magnets 8 which were not needed are used for corrections on a different site.

The invention is not restricted to the correction of magnetic field inhomogeneity. The magnets 8 may provide any necessary correction.

The invention can be applied to the correction of a magnetic field. The invention can be applied chiefly to the correction of the inhomogeneity of a magnetic field of a magnet used in imaging by nuclear magnetic resonance.

I claim:

1. A device comprising:
   permanent cubic magnets; and
   an apparatus for imaging by nuclear magnetic resonance with a main magnet, said apparatus including a plurality of square-section apertures, said apertures being distributed on a periphery of said main magnet of said apparatus, said apertures showing the size of said permanent cubic magnets and provided for containing said cubic magnets therein in order to correct a magnetic field inhomongeneity of said main magnet.

2. Device according to claim 1, characterized by the fact that said permanent cubic magnets (8) have six faces, each of said six faces providing a specific magnetic field.

3. Device according to any one of the claims 1 or 2, further including coils for correcting magnetic field homogeneity.

4. Method for the correction of inhomogeneity of a magnetic field in a region of space, comprising the steps of:
   measuring the magnetic field at points of interest in said region of space;

calculating according to the measurement of said magnetic field, of corrections to be provided to said region of space, calculating corrections to be made by square-shaped permanent magnets placed inside said region of the space, and determining a configuration of said square-shaped permanent magnet giving a most homogeneous field;

introducing a determined plurality of square-section permanent magnets into determined square-section apertures placed on a periphery of said region of the space, according to a given orientation, so as to achieve the determined configuration and, fixing said determined plurality of magnets into said determined aperture to provide said determined configuration.

5. Method according to claim 4, wherein the magnets are cube shaped.

6. Method according to claim 4, characterized by the fact that the calculation step includes the steps of:

calculating an analytic expression of the measured field;

calculating analytic expressions of the fields produced by the correction magnets as a function of their configuration;

choosing the configuration of said square-shaped permanent magnets for which the difference between said analytic expressions of the measured field and of an ideal field sought is equal in absolute value and has a sign contrary to that of the analytic expression of the correction fields.

7. Method according to any one of the claims 4 to 6, including the step of using coils to make corrections of magnetic field inhomogeneity.

8. Method according to claim 6, including the steps of using the permanent magnets to make radial corrections and axial corrections.

9. Method according to any one of claim 4, 5 and 6 including the step of fabricating magnets with high precision of amplitude and orientation of the magnetic moment by stacking layers (81, 82,...8n) of magnetic material, and of nonmagnetic material, to obtain the desired magnetic moment, in a predetermined volume.

10. Method according to claim 9, wherein the fabricated magnet is a cube, the magnetization of the magnetic layers of which is parallel to a ridge of the cube.

* * * * *